(12) United States Patent
Zhang et al.

(10) Patent No.: US 11,869,827 B2
(45) Date of Patent: Jan. 9, 2024

(54) THREE-DIMENSIONAL CAPACITOR-INDUCTOR BASED ON HIGH FUNCTIONAL DENSITY THROUGH SILICON VIA STRUCTURE AND PREPARATION METHOD THEREOF

(71) Applicants: FUDAN UNIVERSITY, Shanghai (CN); SHANGHAI INTEGRATED CIRCUIT MANUFACTURING INNOVATION CENTER CO., LTD, Shanghai (CN)

(72) Inventors: Wei Zhang, Shanghai (CN); Ziyu Liu, Shanghai (CN); Lin Chen, Shanghai (CN); Qingqing Sun, Shanghai (CN)

(73) Assignee: Shanghai Integrated Circuit Manufacturing Innovation Center Co., Ltd., Shanghai (CN)

( * ) Notice: Subject to any disclaimer, the term of this patent is extended or adjusted under 35 U.S.C. 154(b) by 272 days.

(21) Appl. No.: 17/052,847

(22) PCT Filed: Jul. 2, 2020

(86) PCT No.: PCT/CN2020/099976
§ 371 (c)(1),
(2) Date: Mar. 23, 2021

(87) PCT Pub. No.: WO2021/253512
PCT Pub. Date: Dec. 23, 2021

(65) Prior Publication Data
US 2023/0115796 A1    Apr. 13, 2023

(30) Foreign Application Priority Data

Jun. 18, 2020 (CN) .......................... 202010561660.2

(51) Int. Cl.
*H01L 23/48* (2006.01)
*H01L 21/768* (2006.01)
(Continued)

(52) U.S. Cl.
CPC ...... *H01L 23/481* (2013.01); *H01L 21/76898* (2013.01); *H01L 27/01* (2013.01);
(Continued)

(58) Field of Classification Search
CPC . H01L 23/481; H01L 21/76898; H01L 27/01; H01L 24/05; H01L 2224/05541;
(Continued)

(56) References Cited

U.S. PATENT DOCUMENTS

2009/0244808 A1    10/2009  Ohtsuka et al.
2014/0204548 A1    7/2014   Sekine et al.
2020/0091094 A1*   3/2020   Yun .................... H01L 23/5227

FOREIGN PATENT DOCUMENTS

CN    102800647 A    11/2012
CN    105655316 A    6/2016
CN    106158835 A    11/2016

OTHER PUBLICATIONS

Lin, Y. et al.; "Physical and Electrical Characterization of 3D Embedded Capacitor: A High-density MIM Capacitor Embedded in TSV"; 2017 IEEE 67th Electronic Components and Technology Conference; Aug. 3, 2017.
(Continued)

*Primary Examiner* — Herve-Louis Y Assouman
(74) *Attorney, Agent, or Firm* — Thomas E. Lees, LLC

(57) ABSTRACT

The invention pertains to the technical field of semiconductor devices, and specifically relates to a three-dimensional capacitor-inductor based on a high-functional-density through silicon via structure and a manufacturing method, The three-dimensional capacitor-inductor of the present
(Continued)

invention includes: a substrate formed with a through silicon via; a three-dimensional capacitor, formed on a sidewall of the through silicon via, and sequentially including a first metal layer, a second insulating layer; and a second metal layer; and a three-dimensional inductor, composed of center-filled metal of the through silicon via and planar thick metal rewiring, wherein a first insulating layer is provided between the sidewall of the through silicon via and the three-dimensional capacitor, and a third insulating layer is provided between the three-dimensional capacitor and the three-dimensional inductor, The invention can effectively increase the values of capacitance and inductance in an integrated system, and at the same time can integrate capacitors and inductors near the chip in three-dimensional integration, and can also improve the functional density of through silicon via in three-dimensional integration and increase the utilization rate of silicon in system integration. Compared with discrete capacitors and inductors on other organic substrates, the integration can be greatly improved.

10 Claims, 8 Drawing Sheets

(51) Int. Cl.
    *H01L 27/01* (2006.01)
    *H01L 23/522* (2006.01)
    *H01L 23/00* (2006.01)
(52) U.S. Cl.
    CPC .... *H01L 24/05* (2013.01); *H01L 2224/05541* (2013.01); *H01L 2224/05647* (2013.01); *H01L 2224/05684* (2013.01)

(58) Field of Classification Search
    CPC . H01L 2224/05647; H01L 2224/05684; H01L 23/5227; H01L 28/40; H01L 21/76801; H01L 21/76838; H01L 21/76877; H01L 23/5223
    See application file for complete search history.

(56) References Cited

OTHER PUBLICATIONS

Vitale, W. A. et al.; "Ultra fine-pitch TSV technology for ultra-dense high-Q RF inductors"; 2015 Symposium on VLSI Technology; Aug. 27, 2015.
International Search Report and Written Opinion for PCT Application No. PCT/CN2020/099976; China National Intellectual Property Administration; Beijing, China; dated Feb. 25, 2021.
First Office Action for Chinese Patent Application No. 202010561660.2; The State Intellectual Property Office of People's Republic of China; Beijing, China.
Second Office Action for Chinese Patent Application No. 202010561660.2; The State Intellectual Property Office of People's Republic of China; Beijing, China.
First Search Report for Chinese Patent Application No. 202010561660.2; The State Intellectual Property Office of People's Republic of China; Beijing, China.
Second Search Report for Chinese Patent Application No. 202010561660.2; The State Intellectual Property Office of People's Republic of China; Beijing, China.
Supplementary Search Report for Chinese Patent Application No. 202010561660.2; The State Intellectual Property Office of People's Republic of China; Beijing, China.

* cited by examiner

THREE-DIMENSIONAL CAPACITOR-INDUCTOR BASED ON HIGH FUNCTIONAL DENSITY THROUGH SILICON VIA STRUCTURE AND PREPARATION METHOD THEREOF

TECHNICAL FIELD

The invention belongs to the technical field of semiconductor devices, and specifically relates to a three-dimensional capacitor-inductor based on a high-functional-density through silicon via structure and a manufacturing method.

BACKGROUND

As the integration level of integrated circuits continues to increase, a feature size of a device has approached a physical limit. In order to further improve performance and integration level, researchers have begun to continuously increase utilization rate of silicon, that is, functional density. Here, system integration of the chip in three dimensional directions can greatly increase the functional density of the chip. However, as the chip density of system integration increases, signal coupling becomes extremely significant, and more and more decoupling capacitors and inductors are required. Merely relying on the capacitors and inductors on the PCB cannot meet the requirements of chip integration. The reason is that the capacitors and inductors have too small capacitance and inductance values, are too small in quantity, and are far away from one another. Therefore, the manufacturing of three-dimensional capacitors and three-dimensional inductors on silicon with higher capacitance and inductance values is of great significance.

Currently, a three-dimensional capacitor or inductor on silicon is generally a single three-dimensional capacitor based on a through silicon via (TSV) or a three-dimensional inductor based on thick metal rewiring, but the TSV is only used as an interconnect wire. Such TSVs occupy a large area of silicon and have single function. Therefore, the functional density of TSV is low, and the utilization rate of silicon is very low.

SUMMARY

The objective of the present invention is to provide a three-dimensional capacitor-inductor with a through silicon via structure having a high functional density and a high silicon utilization rate and a manufacturing method thereof.

The present invention provides a three-dimensional capacitor-inductor based on a high-functional-density through silicon via structure, including:

a substrate formed with a through silicon via;

a three-dimensional capacitor, formed on a sidewall of the through silicon via, and sequentially including a first metal layer, a second insulating layer, and a second metal layer; and a three-dimensional inductor, composed of center-filled metal of the through silicon via and planar thick metal rewiring, wherein a first insulating layer is provided between the sidewall of the through silicon via and the three-dimensional capacitor, and a third insulating layer is provided between the three-dimensional capacitor and the three-dimensional inductor.

In the three-dimensional capacitor-inductor of the present invention, preferably, the second insulating layer is made of a high-K dielectric material.

In the three-dimensional capacitor-inductor of the present invention, preferably, the first metal layer and the second metal layer are made of Cu, TiN or Cr.

In the three-dimensional capacitor-inductor of the present invention, preferably, the substrate is made of high resistance silicon or glass.

In the three-dimensional capacitor-inductor of the present invention, preferably, the first insulating layer and the third insulating layer are made of silicon oxide or silicon nitride.

The present invention also discloses a method for manufacturing the above three-dimensional capacitor-inductor based on a high-functional-density through silicon via structure, including the following steps:

etching on a substrate to form a blind hole;

forming a first insulating layer in the blind hole and on a surface of the substrate;

forming layers of a three-dimensional capacitor on the first insulating layer, including sequentially depositing a first metal layer, a second insulating layer, and a second metal layer, and removing excessive parts of the second insulating layer and the second metal layer by photolithography and etching, to expose part of a surface of the first metal layer, then removing an excessive part of the first metal layer by photolithography and etching, so that part of the surface of the first insulating layer is exposed to form an under-bump-metal layer;

forming a third insulating layer to cover the second metal layer, the first metal layer, and the first insulating layer;

electroplating metal, and performing chemical mechanical polishing and dry etching to remove an excessive part of the metal, leaving only center-filled metal in the blind hole as a part of a three-dimensional inductor;

performing photolithography and etching on the third insulating, layer, that is on the first metal layer and the second metal layer, so that the first metal layer and the second metal layer are respectively opened with a window, and forming test/connection humps by electroplating and etching;

Sputtering a seed layer on a surface of the center-filled metal of the blind hole, and forming test/connection bumps for a three-dimensional inductor on the surface of the center-filled metal by photolithography, electroplating and etching;

forming temporary bonding to protect a front-surface pattern of the substrate, mechanically grinding, polishing, and dry etching the back of the substrate to expose the back of the through silicon via, and removing parts of the first insulating layer, the first metal layer, the second insulating layer, and the second metal layer at the bottom of the through silicon via by dry etching until the center-filled metal is exposed;

forming back insulation, opening a window by photolithography and etching, and depositing thick metal and etching the thick metal to form interconnection, to form a planar thick metal rewiring part of the three-dimensional inductor; and removing the temporary bonding, and performing packaging.

In the manufacturing method of the present invention, preferably, the second insulating layer is made of a high-K dielectric material.

In the manufacturing method of the present invention, preferably, the first metal layer and the second metal layer are made of Cu, TiN or Cr.

In the manufacturing method of the present invention, preferably, the substrate is made of high resistance silicon or glass.

In the manufacturing method of the present invention, preferably, the center-filled metal includes Cu or W.

The invention can effectively increase the values of capacitance and inductance in an integrated system, and at the same time can integrate capacitors and inductors near the chip in three-dimensional integration, and can also improve the functional density of through silicon via in three-dimensional integration and increase the utilization rate of silicon in system integration. Compared with discrete capacitors and inductors on other organic substrates, the integration can be greatly improved.

DETAILED DESCRIPTION OF THE EMBODIMENTS

Figure 1:
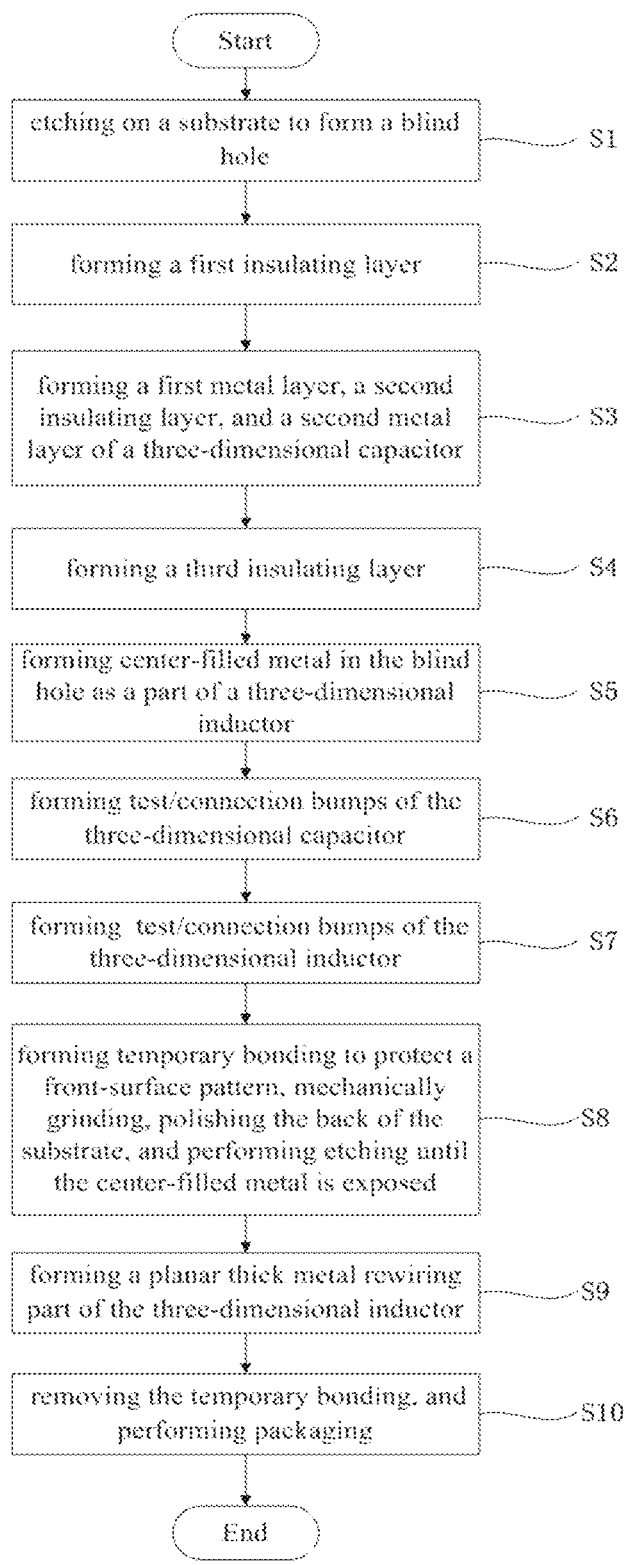
FIG. 1 is a flowchart of a method for manufacturing a three-dimensional capacitor-inductor based on a high-functional-density through silicon via structure of the present invention.

In order to make the objectives, technical solutions and advantages of the present invention clearer, the following will clearly and completely describe the technical solutions in the embodiments of the present invention with reference to the accompanying drawings in the embodiments of the present invention. It should be understood that the specific embodiments described here are only used to explain the present invention, not to limit the present invention. The described embodiments are only a part of the embodiments of the present invention, rather than all the embodiments. Based on the embodiments of the present invention, all other embodiments obtained by those of ordinary skill in the art without creative work shall fall within the protection scope of the present invention.

In the description of the present invention, it should be noted that the orientation or positional relationship indicated by the terms "upper", "lower", "vertical", "horizontal", and the like is based on the orientation or positional relationship shown in the drawings, and is only for convenient description of the present invention and simplify the description, rather than indicating or implying that the device or element referred to must have a specific orientation, or must be constructed and operated in a specific orientation, and therefore cannot be understood as a limitation of the present invention. In addition, the terms "first" and "second" are only used for descriptive purposes, and cannot be understood as indicating or implying relative importance.

In addition, many specific details of the present invention are described below, such as the structure, materials, dimensions, processing method and technology of the device, in order to understand the present invention more clearly. However, as those skilled in the art can understand, the present invention may not be implemented according to these specific details. Unless specifically indicated in the following, each part of the device may be made of materials known to those skilled in the art, or materials with similar functions developed in the future.

In the following, with reference to the accompanying drawings 1-14, a method for manufacturing a three-dimensional capacitor-inductor based on a high-resistance silicon substrate is taken as an embodiment to further illustrate the technical solution of the present invention. FIG. 1 is a flowchart of a method for manufacturing a three-dimensional capacitor-inductor based on a high-functional-density through silicon via structure, and FIGS. 2 to 14 show schematic structural diagrams of each step of the method for manufacturing a three-dimensional capacitor-inductor based on a high-functional-density through silicon via structure.

Figure 2:
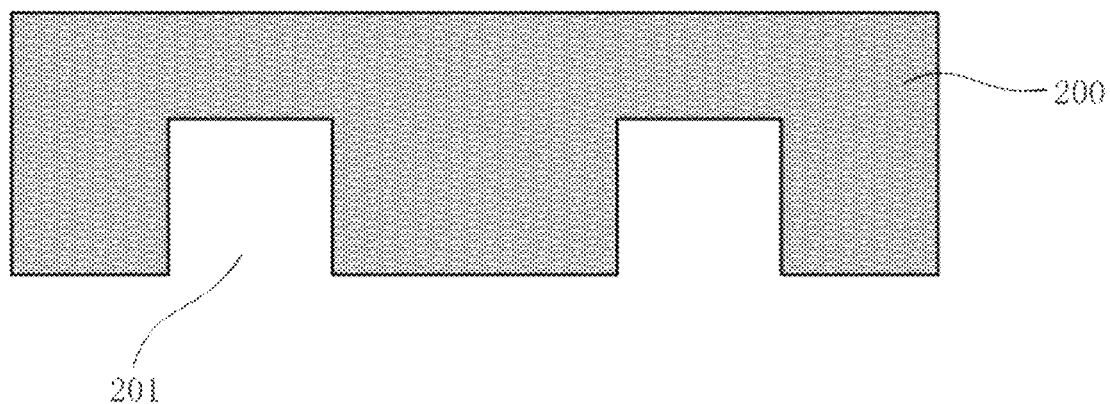
FIGS. 2 to 14 show schematic structural diagrams of each step of the method for manufacturing a three-dimensional capacitor-inductor based on a high-functional-density through silicon via structure.

In step S1, a blind hole is formed by etching on a substrate. Specifically, high-resistance silicon is used as the substrate 200, and a standard optical photolithography process is performed on the substrate 200 to expose a pattern as an original alignment pattern for photolithography. A through silicon via pattern is formed by thin-resist photolithography, and a blind hole 201 with a thickness of 200 microns and a diameter of 50 microns is etched by deep silicon etching. The resulting structure is shown in FIG. 2.

Figure 3:
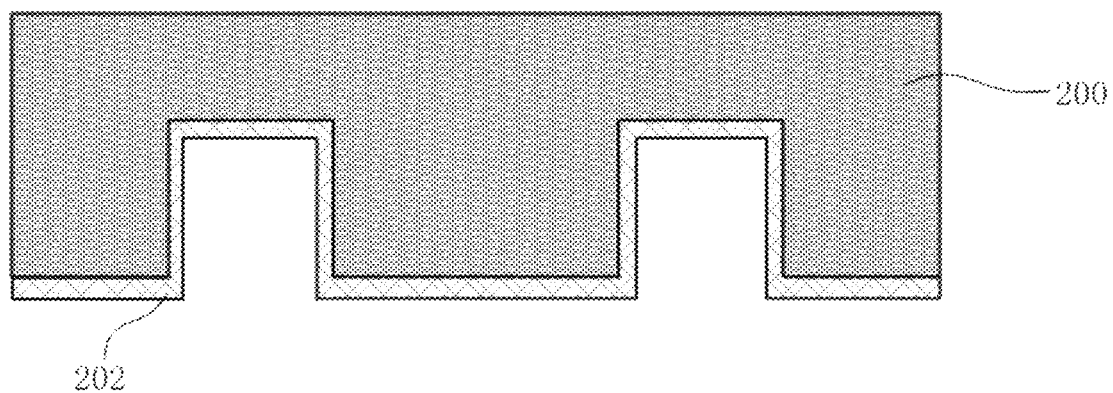

In step S2, on the above structure, a thermal oxidation method is used to form silicon dioxide as a first insulating layer 202. The resulting structure is shown in FIG. 3. The thickness of silicon dioxide is preferably 500 nm, and a thicker insulating layer can effectively reduce the capacitance and inductance produced by the substrate. Then, a chemical vapor deposition (PECVD) method can be used to deposit 200 nm silicon nitride to eliminate the stress of the silicon dioxide. Of course, other stress eliminating methods can also be used.

Figure 4:
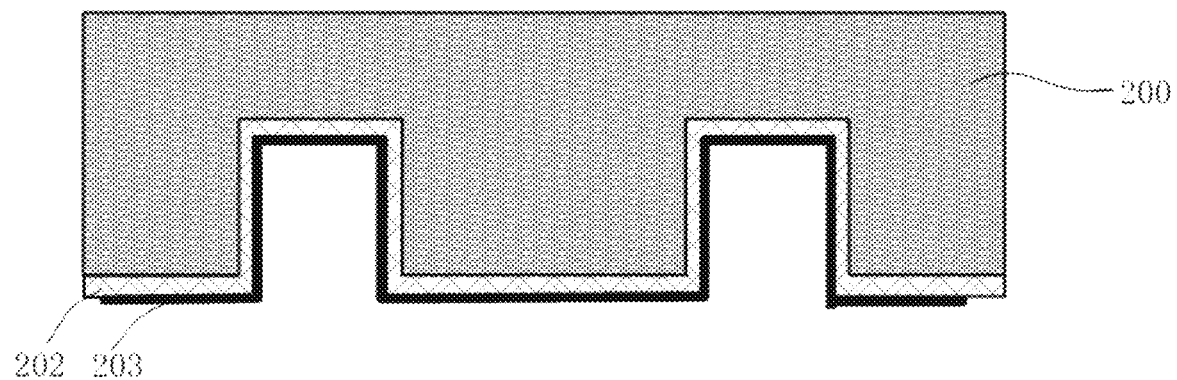
Figure 5:
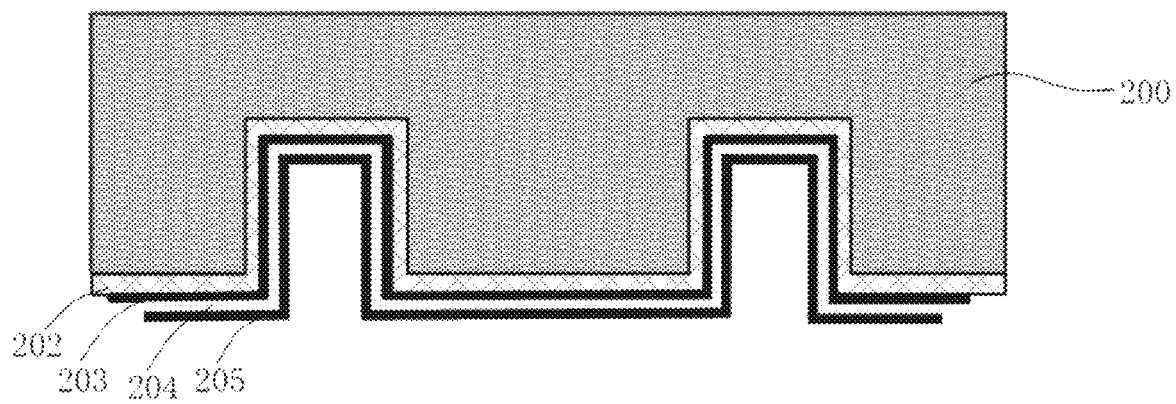

In step S3, as shown in FIGS. 4 to 5, forming the layers of the three-dimensional capacitor on the first insulating layer, including sequentially depositing a first metal layer 203, a second insulating layer 204, and a second metal layer 205. The excessive parts of the second insulating layer 204 and the second metal layer 205 are removed by photolithography and etching to expose part of the surface of the first metal layer 203, and the photoresist is removed. Then, the excessive part of the first metal layer 203 is removed by photolithography and etching, so that part of the surface of the first insulating layer 202 is exposed to form an under-bump-metal layer; and the photoresist is removed. The first metal layer and the second metal layer are preferably made of metals such as Cu, TiN, Cr, and the like. The second insulating layer is preferably made of a high-K dielectric material such as $HfO_2$. The first metal layer, the second metal layer, and the second insulating layer may be manufactured by methods such as atomic layer deposition (ALD), sputtering, and the like.

Figure 6:
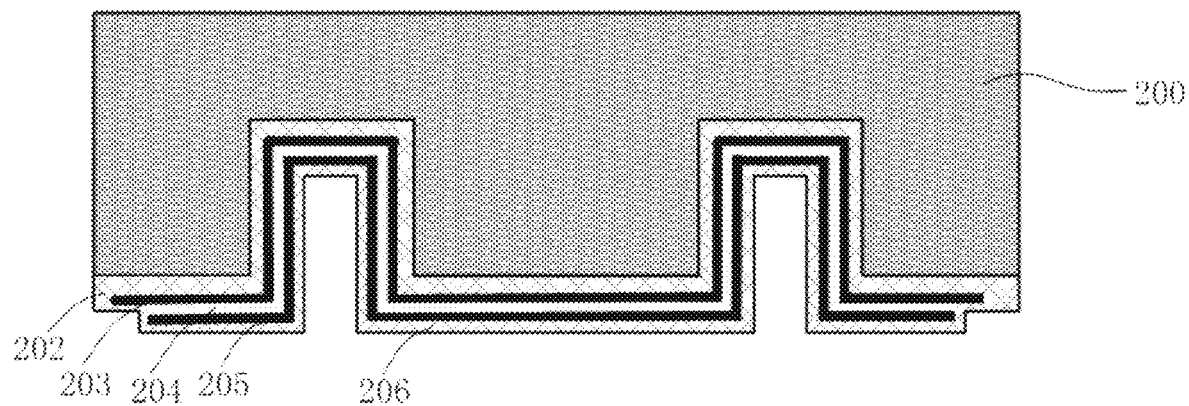

In step S4, a third insulating layer 206 is formed to cover the second metal layer 205, the first metal layer 203, and the first insulating layer 202. The resulting structure is shown in FIG. 6.

Figure 7:
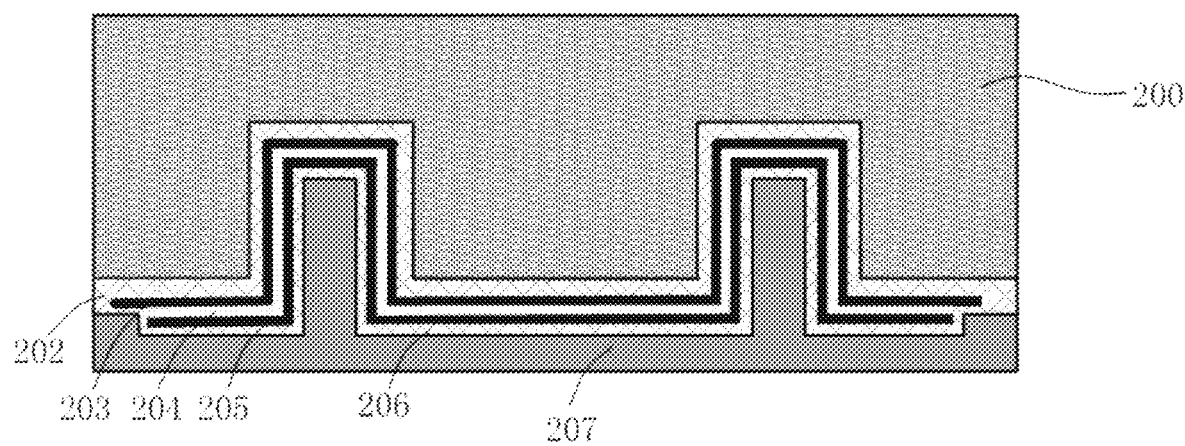
Figure 8:
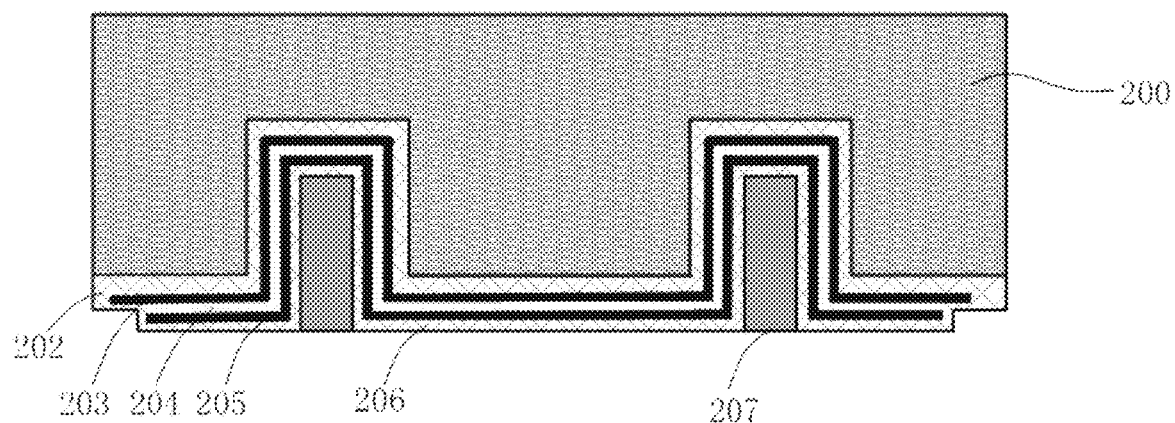

In step S5, a seed layer is deposited and metal 207 is electroplated, as shown in FIG. 7. Then chemical mechanical polishing is performed to remove most of the metal Cu, then annealing is performed to remove the stress between Cu and silicon dioxide, and then dry etching is performed to remove the residual Cu and the convex Cu in the hole, leaving only the center-filled metal 207 in the blind hole as a part of the three-dimensional inductor. The resulting structure is shown in FIG. 8.

Figure 9:
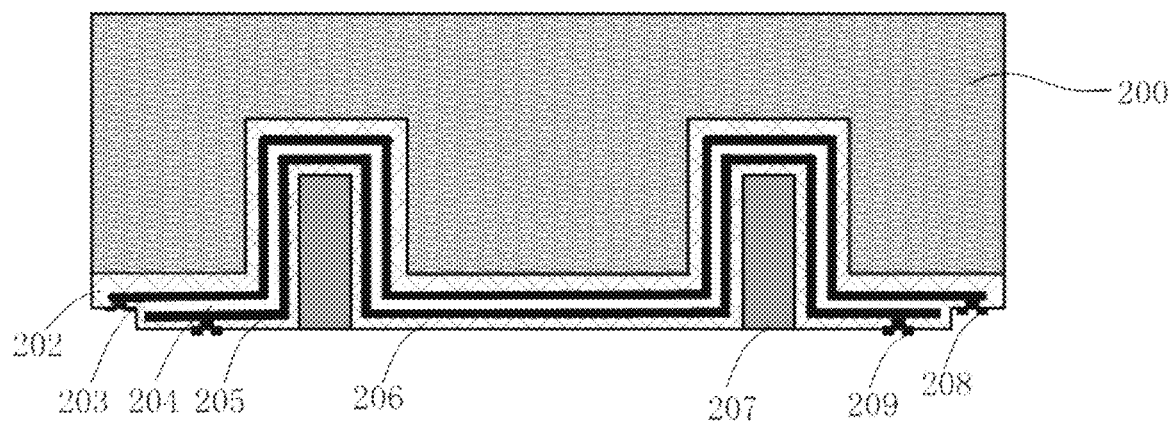

In step S6, photolithography and etching are performed on the third insulating layer 206, which is on the first metal layer 203 and the second metal layer 205, so that the first metal layer 203 and the second metal layer 205 are respectively opened with a window, and test/connection bumps 208 and 209 are produced by electroplating and etching. The resulting structure is shown in FIG. 9.

In step S7, a seed layer is spurred on the surface of the center-filled metal 207 of the blind hole, and test/connection bumps 210 for a three-dimensional inductor is produced on the surface of the center-filled metal by photolithography, electroplating and etching.

Figure 10:
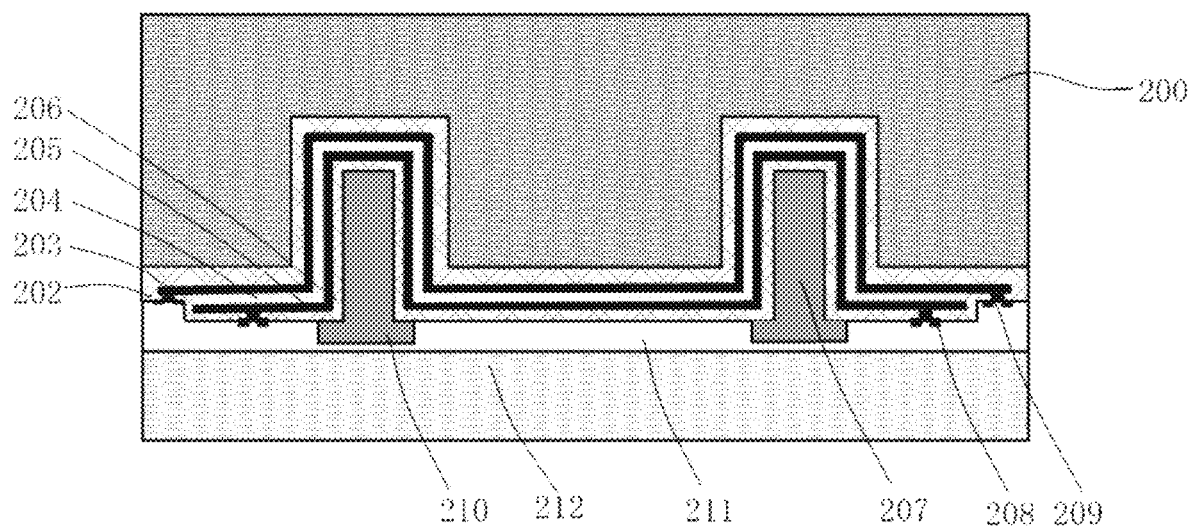
Figure 11:
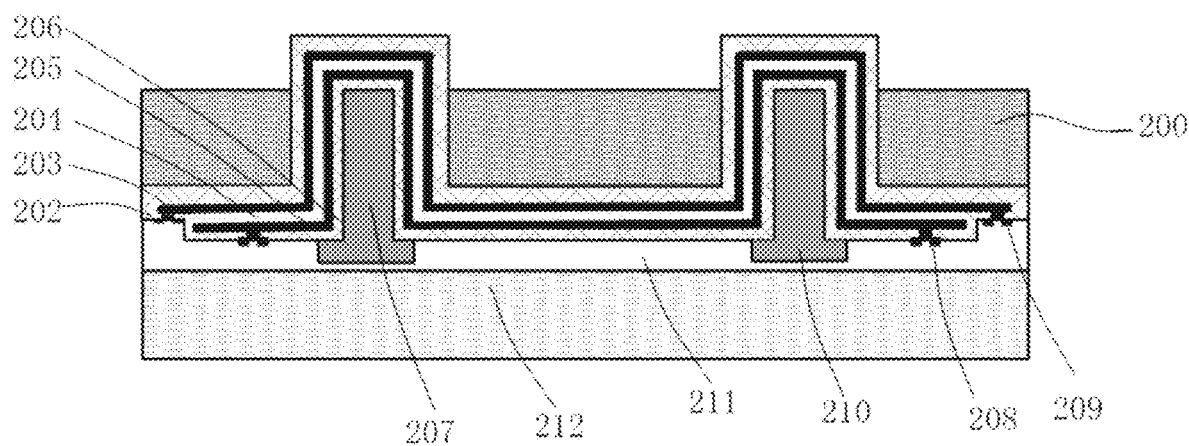
Figure 12:
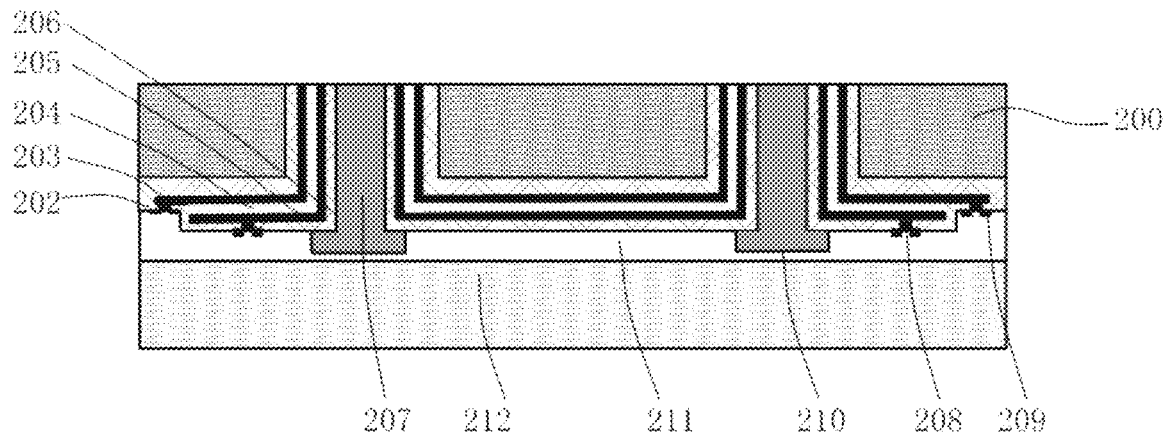

In step S8, transparent glass 212 is temporarily bonded to the front surface of the substrate 200 through temporary bonding glue 211 to protect the front surface pattern. The resulting structure is shown in FIG. 10. The hack of the substrate 200 is mechanically ground and polished to remove silicon with a thickness of 300 micrometers (the total thickness of the silicon substrate is 525 micrometers), and it stops at a distance of 25 micrometers from the bottom of the blind hole. The resulting structure is shown in FIG. 11. Then, the hack of the through silicon via is exposed by dry etching, and parts of the first insulating layer 202, the first metal layer 203, the second insulating layer 204, and the second metal layer 205 at the bottom of the through silicon via are removed by dry etching until the center-filled metal 207 is exposed. The resulting structure is shown in FIG. 12.

Figure 13:
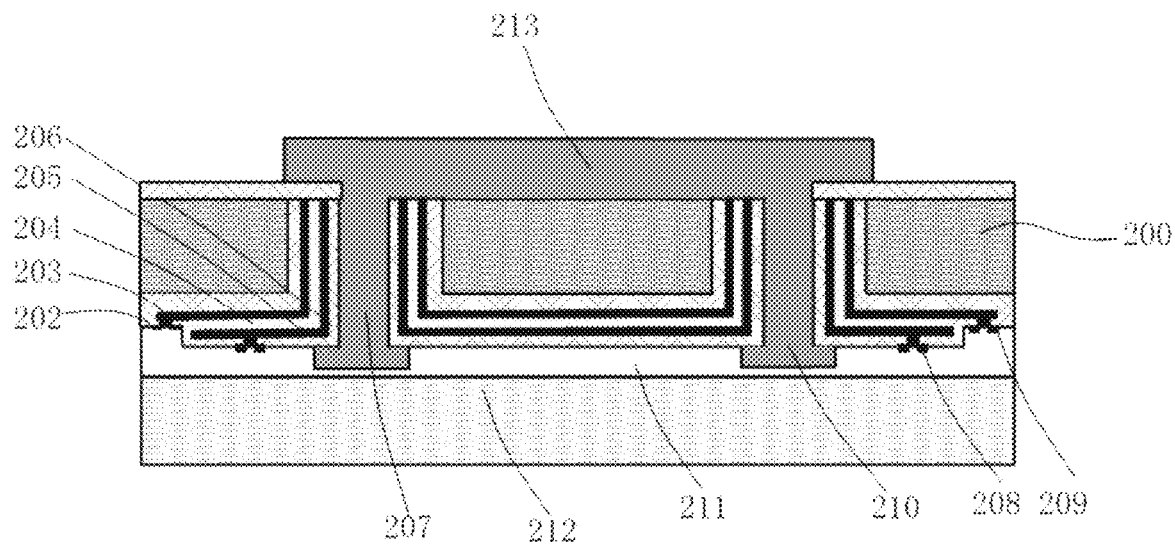

In step S9, back insulation is formed, and a window is opened by photolithography and etching, and then thick metal is deposited and etched to form interconnection, to form a planar thick metal rewiring part 213 of the three-dimensional inductor. The resulting structure is shown in FIG. 13.

In step S10, the temporary bonding is removed, and packaging is performed. The resulting structure is shown in FIG. 14.

Figure 14:
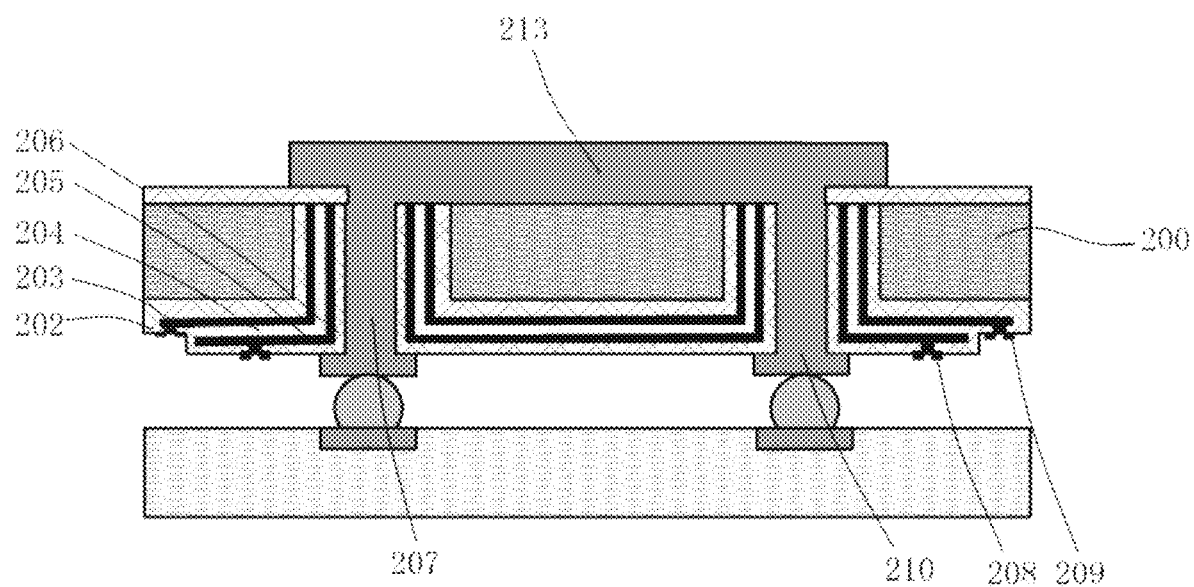

As shown in FIG. 14, the three-dimensional capacitor-inductor based on the high-functional-density through silicon via structure of the present invention includes: a substrate 200 formed with a through silicon via; a three-dimensional capacitor, formed on a sidewall of the through silicon via, and sequentially including a first metal layer 203, a second insulating layer 204, and a second metal layer 205; a three-dimensional inductor, composed of center-filled metal 207 of the through silicon via and planar thick metal rewiring 213; wherein a first insulating layer 202 is provided between the sidewall of the through silicon via and the three-dimensional capacitor, and a third insulating layer 206 is provided between the three-dimensional capacitor and the three-dimensional inductor.

Preferably, the second insulating layer is made of a high-K dielectric material, such as $HfO_2$. The first metal layer and the second metal layer are made of Cu, TiN, Cr and other metals. The substrate can be made of high-resistance silicon, glass, etc. The first insulating layer and the third insulating layer may be made of silicon oxide, silicon nitride, or the like. The center-filled metal is preferably Cu, W, or the like.

The invention subtly forms a metal-insulating layer-metal three-dimensional capacitor on the sidewall of the TSV (Through Silicon Via), and at the same time, the center of the TSV is filled with metal as a part of the three-dimensional inductor and the planar thick metal rewiring together with the metal is used as the three-dimensional inductor. It not only reduces the silicon surface area significantly, effectively increases the values of capacitance and inductance in the integrated system, but also integrates passive components closer to the active components of the chip in three-dimensional integration. It can also increase the functional density of TSVs in three-dimensional integration and increase the utilization rate of silicon in system integration. Compared with discrete capacitors and inductors on other organic substrates, the integration is greatly improved.

The above are only specific embodiments of the present invention, but the protection scope of the present invention is not limited thereto. Any person skilled in the art can easily think of changes or substitutions within the technical scope disclosed in the present invention. All should be covered within the protection scope of the present invention.

The invention claimed is:

1. A three-dimensional capacitor-inductor based on a high-functional-density through silicon via structure, comprising:
   a substrate formed with a through silicon via;
   a three-dimensional capacitor, formed on a sidewall of the through silicon via, and sequentially including a first metal layer, a second insulating layer, and a second metal layer; and
   a three-dimensional inductor, composed center-filled metal of the through silicon via and planar thick metal rewiring,
   wherein a first insulating layer is provided between the sidewall of the through silicon via and the three-dimensional capacitor, and a third insulating layer is provided between the three-dimensional capacitor and the three-dimensional inductor.

2. The three-dimensional capacitor-inductor based on a high-functional-density through silicon via structure according to claim 1, wherein the second insulating layer is made of a high-K dielectric material.

3. The three-dimensional capacitor-inductor based on a high-functional-density through silicon via structure according to claim 1, wherein the first metal layer and the second metal layer are made of Cu, TiN or Cr.

4. The three-dimensional capacitor-inductor based on a high-functional-density through silicon via structure according to claim 1, wherein the substrate is made of high resistance silicon or glass.

5. The three-dimensional capacitor-inductor based on a high-functional-density through silicon via structure according to claim 1, wherein the first insulating layer and the third insulating layer are made of silicon oxide or silicon nitride.

6. A method for manufacturing a three-dimensional capacitor-inductor based on a high-functional-density through silicon via structure, comprising steps of:
   etching on a substrate to form a blind hole;
   forming a first insulating layer in the blind hole and on a surface of the substrate;
   forming layers of a three-dimensional capacitor on the first insulating layer, including sequentially depositing a first metal layer, a second insulating layer, and a second metal layer. and removing excessive parts of the second insulating layer and the second metal layer by photolithography and etching, to expose part of a surface of the first metal layer, then removing an excessive part of the first metal layer by photolithography and etching, so that part of the surface of the first insulating layer is exposed to form an under-bump-metal layer;
   forming a third insulating layer to cover the second metal layer, the first metal layer, and the first insulating layer;
   electroplating metal, and performing chemical mechanical polishing and dry etching to remove an excessive part of the metal, leaving only center-filled metal in the blind hole as a part of a three-dimensional inductor;
   performing photolithography and etching on the third insulating layer, which is on the first metal layer and the second metal layer, so that the first metal layer and the second metal layer are respectively opened with a window, and forming test/connection bumps by electroplating and etching;

sputtering a seed layer on a surface of the center-filled metal of the blind hole, and forming test/connection bumps fir a three-dimensional inductor on the surface of the center-filled metal by photolithography, electroplating and etching;

forming temporary bonding to protect a front-surface pattern of the substrate, and mechanically grinding, polishing, and dry etching the back of the substrate to expose the back of the through silicon via, and removing parts of the first insulating layer, the first metal layer, the second insulating layer, and the second metal layer at the bottom of the through silicon via by dry etching until the center-filled metal is exposed;

forming back insulation, opening a window by photolithography and etching, and depositing thick metal and etching the thick metal to form interconnection, to form a planar thick metal rewiring part of the three-dimensional inductor; and removing the temporary bonding, and performing packaging.

7. The method for manufacturing a three-dimensional capacitor-inductor based on a high-functional-density through silicon via structure according to claim 6, wherein the second insulating layer is made of a high-K dielectric material.

8. The method for manufacturing a three-dimensional capacitor-inductor based on a high-functional-density through silicon via structure according to claim 6, wherein the first metal layer and the second metal layer are made of Cu, TiN or Cr.

9. The method for manufacturing a three-dimensional capacitor-inductor based on a high-functional-density through silicon via structure according to claim 6, wherein the substrate is made of high resistance silicon or glass.

10. The method for manufacturing a three-dimensional capacitor-inductor based on a high-functional-density through silicon via structure according to claim 6, wherein the center-filled metal includes Cu, W.

* * * * *